(12) United States Patent
Ochi

(10) Patent No.: US 6,917,227 B1
(45) Date of Patent: Jul. 12, 2005

(54) EFFICIENT GATE DRIVER FOR POWER DEVICE

(75) Inventor: Sam Seiichiro Ochi, Saratoga, CA (US)

(73) Assignee: IXYS Corporation, Santa Clara, CA (US)

( * ) Notice: Subject to any disclaimer, the term of this patent is extended or adjusted under 35 U.S.C. 154(b) by 4 days.

(21) Appl. No.: 10/136,844

(22) Filed: Apr. 30, 2002

Related U.S. Application Data
(60) Provisional application No. 60/288,664, filed on May 4, 2001.

(51) Int. Cl.$^7$ ................................................ H03K 3/00
(52) U.S. Cl. ..................... 327/111; 327/110; 327/112; 327/376; 327/377
(58) Field of Search .............................. 327/112, 108, 327/110, 111, 82–87

(56) References Cited

U.S. PATENT DOCUMENTS

| | | |
|---|---|---|
| 5,534,814 A | 7/1996 | Archer |
| 5,550,436 A | 8/1996 | Houk |
| 5,900,683 A | 5/1999 | Rinehart et al. |
| 5,969,964 A | 10/1999 | Mangtani |
| 5,978,312 A * | 11/1999 | Manning |
| 6,002,213 A | 12/1999 | Wood |
| 6,063,682 A * | 5/2000 | Sultan et al. ............. 438/305 |
| 6,222,744 B1 | 4/2001 | Pernyeszi |
| 6,262,618 B1 | 7/2001 | Maggiolino |
| 6,307,409 B1 * | 10/2001 | Wrathall |

* cited by examiner

*Primary Examiner*—Fetsum Abraham
(74) *Attorney, Agent, or Firm*—Townsend and Townsend and Crew LLP

(57) ABSTRACT

A power module includes a power semiconductor device having a first terminal, a second terminal, and a third terminal. The second terminal is a control terminal to regulate flow of electricity between the first and third terminals. A gate driver has an output node coupled to the second terminal of the power device. The gate driver includes an upper transistor and a lower transistor provided in a half-bridge configuration. The output node of the gate driver is provided between the upper and lower transistors. A first delay circuit is coupled to a control terminal of the upper transistor to provide a first delay period for a first gate drive signal being applied to the control terminal of the upper transistor. A second delay circuit is coupled to a control terminal of the lower transistor to provide a second delay period for a second gate drive signal being applied to the control terminal the lower transistor. The first delay period is different from the second delay period.

14 Claims, 7 Drawing Sheets

EFFICIENT GATE DRIVER FOR POWER DEVICE

CROSS-REFERENCES TO RELATED APPLICATIONS

This application claims priority to U.S. Provisional Patent Application No. 60/288,664, filed on May 4, 2001, which is incorporated by reference herein for all purposes.

BACKGROUND OF THE INVENTION

The present invention relates to a gate driver for power semiconductor devices.

Many low voltage electronic circuits, e.g., MOSFET devices, are used to drive high voltage switching transistors, e.g., power MOSFETs, insulated gate bipolar transistor devices (IGBTs), gate controlled thyristors, and the like. A power semiconductor switch or device is switched from a nonconducting state to a conducting state by raising the gate-source voltage from below to above a threshold voltage.

One or more low voltage transistors, coupled to an output node of the gate driver, apply appropriate voltages to the gate or control terminal of the power device to turn on or turn off the power device. When the power device is an N-channel metal oxide semiconductor field effect transistor (NMOSFET), the device is turned on by applying a high voltage to the gate of the power switch and turned off by applying a low voltage to the gate. In contrast, if the power device is a P-channel metal oxide semiconductor field effect transistor (PMOSFET), the device is turned on by applying a low voltage to the gate of the power switch and turned off by applying a high voltage to the gate.

Circuitry of the gate driver may be configured a number of different ways. In one common configuration, the gate driver includes two transistors, i.e., upper and lower transistors, connected in series in a half bridge configuration. The upper transistor is a P-type transistor, such as a PMOSFET or PNP bipolar transistor. The lower transistor is an N-type transistor, such an NMOSFET or NPN bipolar transistor. An output node of the gate driver is coupled to a node between the two transistors to output and apply a high or low potential to the gate of the power switch according to the conductive states of the two transistors in series.

BRIEF SUMMARY OF THE INVENTION

In one embodiment, a power module includes a power semiconductor device having a first terminal, a second terminal, and a third terminal. The second terminal is a control terminal to regulate flow of electricity between the first and third terminals. A gate driver has an output node coupled to the second terminal of the power device. The gate driver includes an upper transistor and a lower transistor provided in a half-bridge configuration. The output node of the gate driver is provided between the upper and lower transistors. A first delay circuit is coupled to a control terminal of the upper transistor to provide a first delay period for a first gate drive signal being applied to the control terminal of the upper transistor. A second delay circuit is coupled to a control terminal of the lower transistor to provide a second delay period for a second gate drive signal being applied to the control terminal the lower transistor. The first delay period is different from the second delay period.

In another embodiment, a high frequency gate driver includes a first transistor and a second transistor provided in a half-bridge configuration. An output node is provided between the first and second transistors. A first delay circuit is coupled to a first control terminal of the first transistor to provide a first delay period for a first gate drive signal being applied to the first control terminal. A second delay circuit is coupled to a second control terminal of the second transistor to provide a second delay period for a second gate drive signal being applied to the second control terminal. The first delay period is different from the second delay period.

In another embodiment, a gate driver for a power semiconductor switch includes first and second transistors in a half-bridge configuration. An output node is provided between the transistors and coupled to a control terminal of the power switch. A first delay circuit to provide a first delay to a first gate drive signal is applied to the first transistor. A second delay circuit to provide a provide a second to a second gate drive signal is applied to the second transistor.

In yet another embodiment, a method of operating a gate driver for a power semiconductor device includes providing a first gate drive signal to be applied a first control terminal of the first transistor with a first delay and providing a second gate drive signal to be applied a second control terminal of the second transistor with a second delay. The gate driver has first and second transistors in a half-bridge configuration. The first delay and the second delay are different.

DETAILED DESCRIPTION OF THE INVENTION

Embodiments of the present invention relate to a gate driver for a power semiconductor switch or device as well as a power module having a gate driver and a power semiconductor device. In one embodiment, a gate driver has a tri-state output: a first state (turn-on state) that outputs a high voltage, a second state (turn-off state) that outputs a low voltage, and a third state (high impedance state) that places the gate driver at a high impedance state. The high impedance state may be used to turn off the power device slowly during occurrences of sudden current spikes to prevent device damages. In one embodiment, the gate driver has an input node to place the gate driver in a high impedance state according to the signals received.

Figure 1:
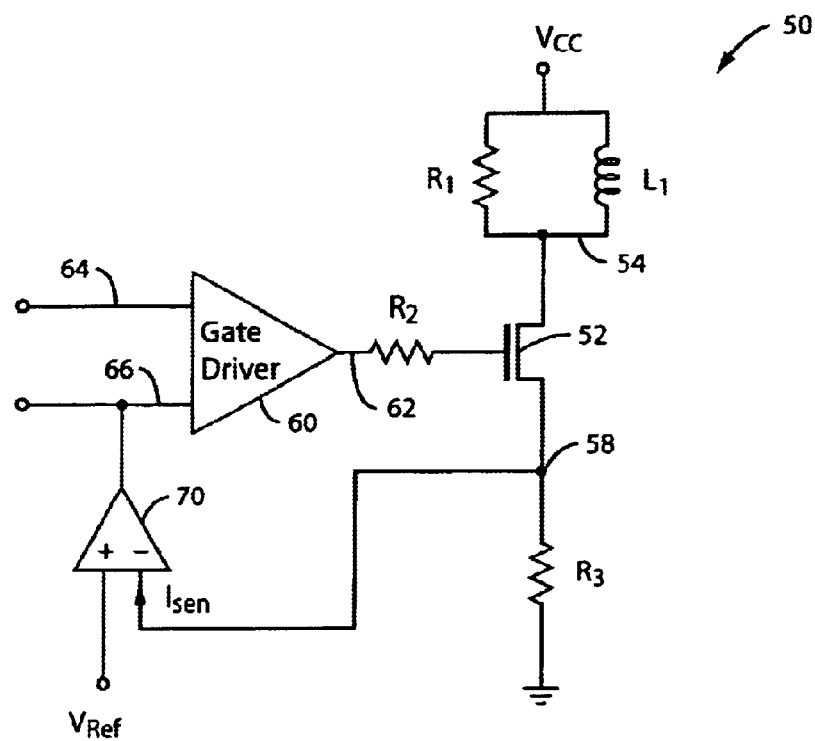
FIG. 1 illustrates a schematic diagram of a conventional power module having a gate driver and a power semiconductor device.

Referring to FIG. 1, a conventional power module 50 includes a power semiconductor switch or device 52, e.g., a power MOSFET, having a first terminal coupled to a high voltage source, a second or control terminal coupled to an output node of a gate driver, and a third terminal coupled to a low voltage source or ground. As used herein, a second terminal of a transistor generally refers to a control terminal, such as a gate, that regulates the electrical current flow between the other two terminals of the device. Accordingly, the two terms "second terminal" and "control terminal" are used interchangeably when used in connection with a transistor.

A load 54, represented by an inductor L1 and a resistor R1, is coupled to the first terminal, e.g., a drain electrode, of the switch 52. One end of a resistor R2 is coupled to the second terminal of the switch, while the other end is coupled to an output node of a gate driver, as described below. The resistor R2 generally has a relatively low resistance and is provided to control the turn-on or turn-off speed of the switch. A resistor R3 is coupled to the third terminal, e.g., a source electrode, and to a low voltage source or ground. A sense node 58, provided between the third terminal and the resistor R3, is coupled to a comparator 70, to enable detection of any unusual current spikes and turn off the switch to prevent it from being damaged, as explained below. In one embodiment, a second power switch (not shown) is provided in series with the switch 52 and the ground in a half-bridge configuration, where an output node is provided between the two power switches.

A gate driver 60, having an output node 62 and input nodes 64 and 66, is coupled to the other end of the resistor R2, so that the switch control signals may be applied to the control terminal of the switch 52. The input node 64 receives the switch control signals from an external source. The input node 66 receives output signals from the comparator 70.

The comparator 70 receives a reference signal $V_{ref}$ and a sense signal $I_{sen}$. The sense signal is received from the sense node 58, provided between the switch 52 and resistor R3 according to one embodiment of the present invention. The signal $V_{ref}$ is used to determine whether or not the amounts of current outputted by the switch 52 exceed the circuit specification. In one embodiment, the signal $I_{sen}$ may be converted to a signal $V_{sen}$. The comparator then compares the two inputted signals and outputs a first signal, e.g., high voltage signal, if the signal $V_{sen}$ is no more than the signal $V_{ref}$. Otherwise, the comparator outputs a second signal, e.g., low voltage signal, that initiates an emergency turn-off of the switch 52.

Figure 2:
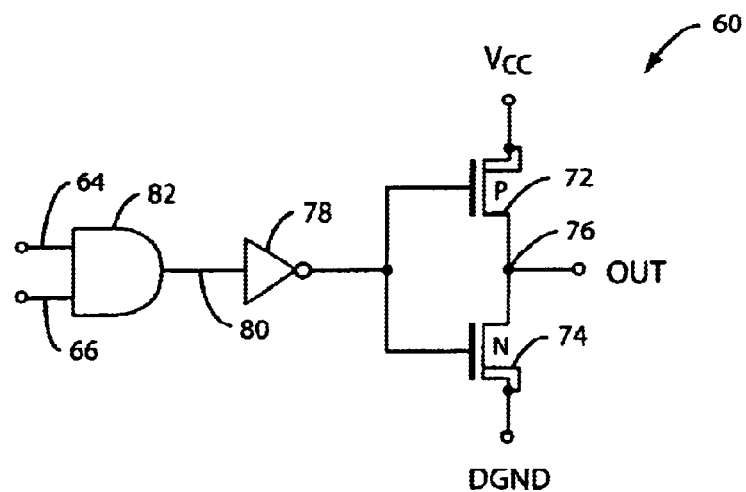
FIG. 2 illustrates a schematic diagram of a conventional gate driver for a power semiconductor device.

FIG. 2 illustrates a schematic circuit diagram of the gate driver 60. The gate driver 60 includes a PMOS transistor 72 and an NMOS transistor 74 in series in a half-bridge configuration . The PMOS is coupled to a high voltage source Vcc, e.g., 15 volts, and the NMOS is coupled to a low voltage source DGND. An output node 76, provided between the two transistors, is coupled to the resistor R2 of the power module 50 and corresponds to the node 62 of FIG. 1. An inverter 78 is coupled to the control terminals of the transistors 72 and 74. An input 80 of the invertor receives an output signal from a signal generator 82. The signal generator is a circuit that outputs a high voltage signal to place the gate driver 60 in the turn-on state and a low voltage signal to place the gate driver 60 in the turn-off state. The signal generator is configured to output a low voltage signal if the comparator indicates that the signal $V_{sen}$ is greater than the signal $V_{ref}$ via the input node 66. In one embodiment, the signal generator 82 is an AND gate (not shown), but other logic gates or a combination thereof may be used in other embodiments.

For example, in operation, when a high input voltage signal is received at the input 80, a low voltage signal is outputted by the invertor, thereby turning on the PMOS transistor and turning off the NMOS transistor. As a result, a high input voltage is outputted as a switch control signal to the switch 52 to turn it on. However, if a low input voltage signal is received at the input 80, a high voltage signal is outputted to the gates of the transistors 72 and 74 to turn off the PMOS 72 and turn on the NMOS 74. Consequently, a low input voltage is outputted as a switch control signal to the power switch 52 to turn it off.

The gate driver 60 provides two conductive or electrical states: (1) a high output voltage, or (2) a low output voltage. Accordingly, the gate driver 60 only provides a hard turn-on or hard turn-off options. Although these two states are sufficient under normal operating conditions, a problem may result when the switch 52 experiences a sudden current spike. The switch would then be turned off hard according to the output signal from the comparator. This would generate a high transient energy that may damage the switch and related circuits.

Among other reasons, overheating and shorting of the of the inductance L1 is one reason for such a current spike. For example, if the circuit is shorted, the inductance L1 with an initial inductance of 100 $\mu$H may suddenly be provided with 0.1 $\mu$H, thereby generating a large current spike through the switch 52 since the current flow is inversely proportional to the inductance of the circuit. If this current spike is turned off suddenly with an emergency turn-off measure, a large transient voltage that may damage the switch and related circuits is generated. For example, the switch may be placed in an avalanche breakdown condition due to the high transient voltage.

Figure 3A:
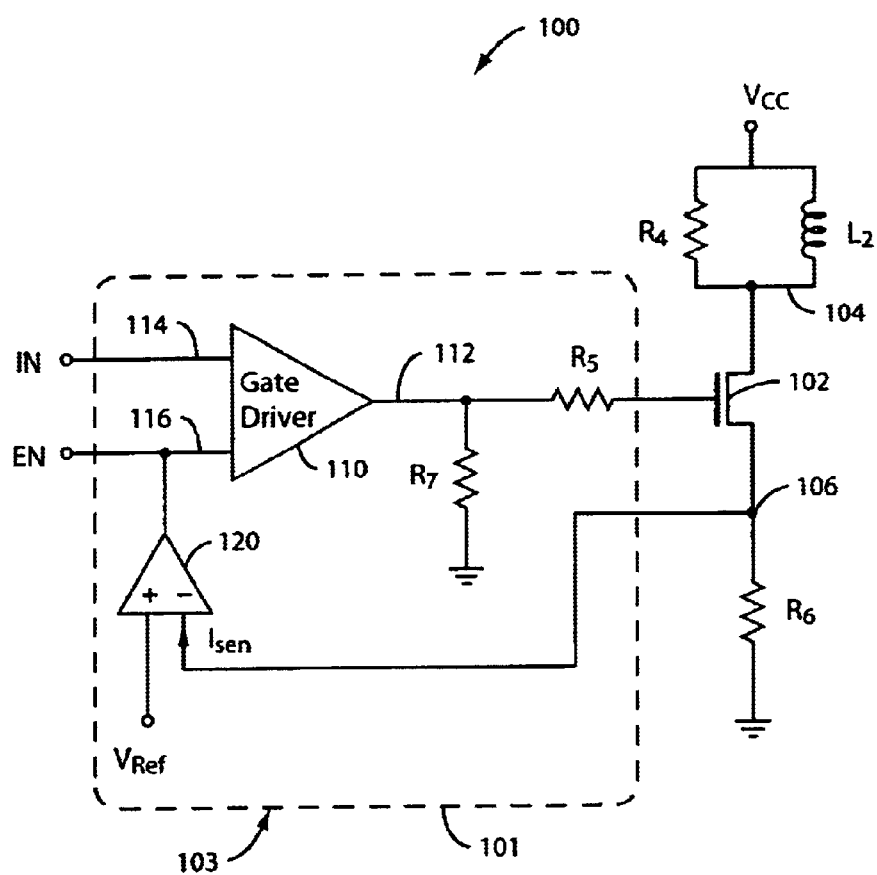
FIG. 3 illustrates a schematic diagram of a power module having a gate driver and a power semiconductor device according to one embodiment of the present invention.

Referring to FIG. 3A, in one embodiment, a power module 100 includes a power semiconductor switch or device 102, e.g., a power NMOSFET, having a first terminal coupled to a high voltage source, a second or control terminal coupled to a gate driver, and a third terminal coupled to a resistor R6 that is coupled to a low voltage source or ground. One end of a load 104, represented by an inductor L2 and a resistor R4, is coupled to the first terminal, e.g., a drain electrode, of the switch 102. Another end of the load 104 is coupled to a high voltage source $V_{bus}$. In one embodiment, the high voltage source $V_{bus}$ provides about 140 volts to the load 104.

One end of a resistor R5 is coupled to the second terminal of the switch, and the other is coupled to the gate driver. The resistor R5 generally has a relatively low resistance, e.g., about 1 ohm, and is used to control the turn-on or turn-off speed of the switch. A sense node 106 is provided between the third terminal, e.g., a source electrode, of the switch and the resistor R6 to enable detection of any unusual current spike in the switch 102. In one embodiment, another switch (not shown) is provided in series with the switch 102 in a half-bridge configuration, wherein an output node is coupled between the two switches to output currents to an external circuit.

A gate driver 110 has an output node 112 and input nodes 114 and 116. The input node 114 receives control input signals, and the input node 116 receives enable and disable signals from a comparator 120. The output of the gate driver 110 is coupled to the resistor R5 to drive the switch 102 by applying switch drive signals to the control terminal of the switch 102.

In one embodiment, the gate driver 110 is configured to provide three conductive or electrical states (or tri-state outputs): (1) a turn-on state, (2) a turn-off state, and (3) a high impedance state. The gate driver is in the turn-on state if it outputs a high voltage to turn on the switch 102, and in the turn-off state if it outputs a low voltage to turn off the switch 102. If the switch is a PMOSFET, the gate driver is in the turn-on state if it outputs a low voltage to turn on the switch 102, and in the turn-off state if it outputs a high voltage to turn off the switch. The gate driver is in the high impedance state if the output node of the gate driver is provided with a high impedance.

Referring back to FIG. 3A, a first end of a pull-down resistor R7 is coupled to the node 112. The resistor R7 has a relatively large resistance value, e.g., 1,000 to 10,000 ohms. The second end of the resistor R7 is grounded. In one embodiment, the resistor R7 has about 3,000 ohms. The resistor R7 and the high impedance state of the gate driver 110 are used together to turn off the switch 102 slowly, i.e., to perform a soft turn-off, during an emergency turn-off operation, as explained in more detail later.

The comparator 120 receives a reference signal $V_{ref}$ and a sense signal $I_{sen}$. The sense signal is received from the node 106 and represents the amount of current flowing through the switch 102. The signal $V_{ref}$ represents a maximum level of current or voltage that the switch 102 or related circuits are designed to handle safely. In one embodiment, the signal $I_{sen}$ is converted to a signal $V_{sen}$. The comparator then compares the $V_{sen}$ and $V_{ref}$ signals and outputs a first signal (enable signal) if the signal $V_{sen}$ is no more than the signal $V_{ref}$. Otherwise, the comparator outputs a second signal (disable signal) that initiates an emergency turn-off operation of the switch 102. In one embodiment, the enable signal is a high voltage signal, and the disable signal is a low voltage signal. The output of disable signal by the comparator 120 causes the gate driver 110 to enter into a high impedance state and overrides any signal received at the input node 114, according to one embodiment of the present invention.

In one embodiment, the gate driver 110, resistors R5 and R7, and comparator 120, collectively referred as a gate driving circuit assembly 103, are all provided within a single semiconductor ship 101.

Figure 3B:
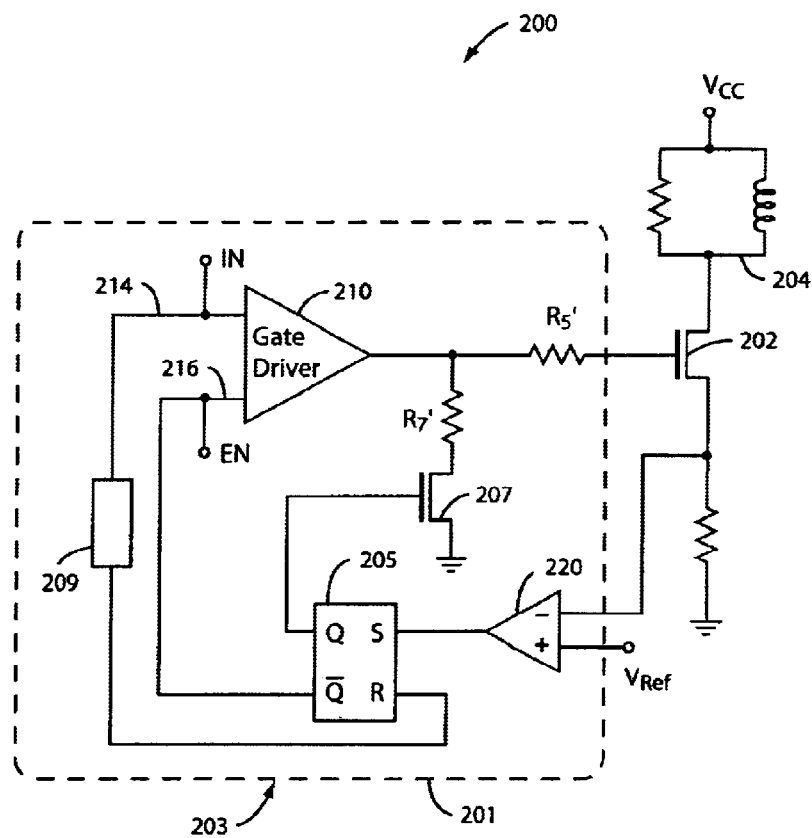

Referring to FIG. 3B, in another embodiment, a power module 200 includes a power semiconductor switch or device 102', e.g., a power NMOSFET, a load 104', and a gate driving circuit assembly 203 including various circuits. The gate driving circuit assembly 203 is provided within a single semiconductor chip according to one implementation. The circuit assembly 203 includes a gate driver 210, a comparator 220, and resistors R5' and R7'. These correspond to the gate driver 110, the comparator 120, and the resistors R5 and R7 of the power module 100, respectively.

In addition, the power module 200 includes a transistor 207, provided between the resistor R7' and the ground, to prevent current leakage at the output node of the gate driver 210. The transistor 207 is turned off when the gate driver 210 is activated. A set-reset flip flop 205 is coupled to the output node of the comparator 220 to regulate the gate driver 210 and the transistor 207. A first output Q of the flip flop 205 is coupled to the gate of the transistor 207. A second output Q-bar of the flip flop 205 is coupled to one of the inputs 216 of the gate driver 210. The other input 214 of the gate driver 210 is coupled to an input of the flip flop 205 to reset it periodically. In one implementation, a differentiator 209 is coupled to the input 214 of the gate driver and the reset input of the flip flop 205 to provide a reset signal to the flip flop.

Figure 4:
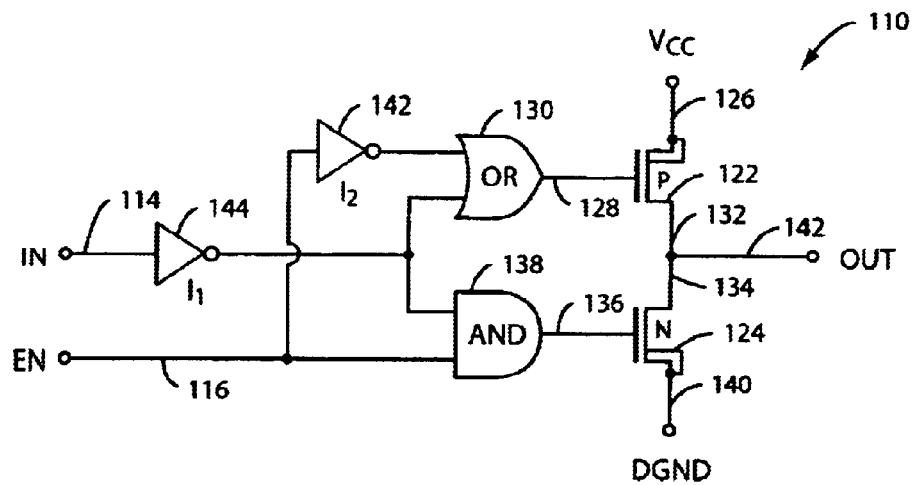
FIG. 4 illustrates a schematic diagram of a gate driver for a power semiconductor device according to one embodiment of the present invention.

FIG. 4 illustrates a schematic circuit diagram of the gate driver 110 according to one embodiment of the present invention. The gate driver 110 includes a first or upper transistor 122 and a second or lower transistor 124 in series in a half-bridge configuration. A first terminal 126 of the upper transistor is coupled to a high voltage source Vcc of about 15 volts. A second or control terminal 128 of the upper transistor is coupled to an OR gate 130. A third terminal 132 of the upper transistor is coupled to a first terminal 134 of the lower transistor. A second terminal 136 of the lower transistor is coupled to an AND gate 138. A third terminal 140 of the lower transistor is grounded. An output node 142, corresponding to the node 112 of FIG. 3, is provided between the upper and lower transistors.

In one embodiment, the upper transistor is a P-type transistor, such as a PMOS transistor or PNP bipolar transistor. The lower transistor is an N-type transistor, such as an NMOS transistor or NPN bipolar transistor. The upper and lower transistors 122 and 124 are generally significantly smaller than the power switch 102 that is used to handle a high voltage, e.g., about 100 volts or more, and generate a large amount of current, e.g., about 10 amperes or more. In comparison, the upper and lower transistors 122 and 124 are configured to handle about 5–15 volts and generate about 2 amperes according to one embodiment of the present invention.

The gate driver 110 includes first and second inverters 142 and 144. An output of the first inverter 142 is coupled to an input of the OR gate 130. A first input of the inverter 142 is coupled to the node 116 to receive the enable or disable signal outputted by the comparator 120. An output of the second inverter 144 is coupled to a second input of the OR gate 130 and a first input of the AND gate 138. A second input of the AND gate 136 is coupled to the node 116 to receive the enable or disable signal.

In operation, the gate driver 110 is placed in the first conductive or turn-on state when the upper transistor 122 is on and the lower transistor 124 is off, thereby placing the node 142 at a high potential and causing electricity to flow to the control terminal of the power switch 102. The high resistance resister R7 is provided so that most of the electrical current from the gate driver 110 is applied to the second terminal rather than be diverted to the ground (see, FIG. 3).

In one embodiment, the gate driver is at the turn-on state when the node 116 receives an enable signal from the comparator 120 and the node 114 receives a high voltage signal. The comparator transmits an enable signal when the switch 102 is operating under normal conditions, i.e., there is no sharp current spike, so the signal $V_{sen}$ is not greater than the signal $V_{ref}$. In the present embodiment, the enable signal is represented by a high voltage signal, e.g., logic "1", and the disable signal represented by a low voltage signal, e.g., logic "0". In another embodiment, the enable signal may be a low voltage signal, and the disable signal may be a high voltage signal.

The gate driver is at the second conductive or tun-off state when the upper transistor is off and the lower transistor is on, thereby grounding the node 142. As a result, the control terminal of the power switch 102 is also quickly brought to a low potential or is grounded. The switch 102 is turned off as the voltage applied to the control terminal is decreased below the threshold voltage. In the present embodiment, the gate driver is at the turn-off state when the node 116 receives an enable signal from the comparator 120 and the node 114 receives a low voltage signal.

The gate driver is at the third conductive or high impedance state when both the upper and lower transistors are turned off. The gate driver is at the high impedance state if a disable signal is received at the node 116. The disable signal overrides the control signal received at the node 114. That is, the signal received at the node 114 does not effect the turn-on or turn-off characteristics of the upper and lower transistors when the disable signal is applied at the node 116.

The disable signal is outputted by the comparator if a sharp current spike in the switch 102 is detected. A large $I_{sen}$ signal, representing the current spike, is applied to the comparator. The signal $I_{sen}$ is converted to a signal $V_{sen}$, where the $V_{sen}$ is greater than $V_{ref}$. The comparator, in turn, outputs a disable signal to the node 114 to place the gate driver at the high impedance state. The charges applied to the control terminal of the switch are slowly dissipated via the resistor R7. As a result, the switch 102 undergoes a soft turn-off, thereby preventing generation of a large, harmful transient voltage spike which may damage the switch.

Figure 5:
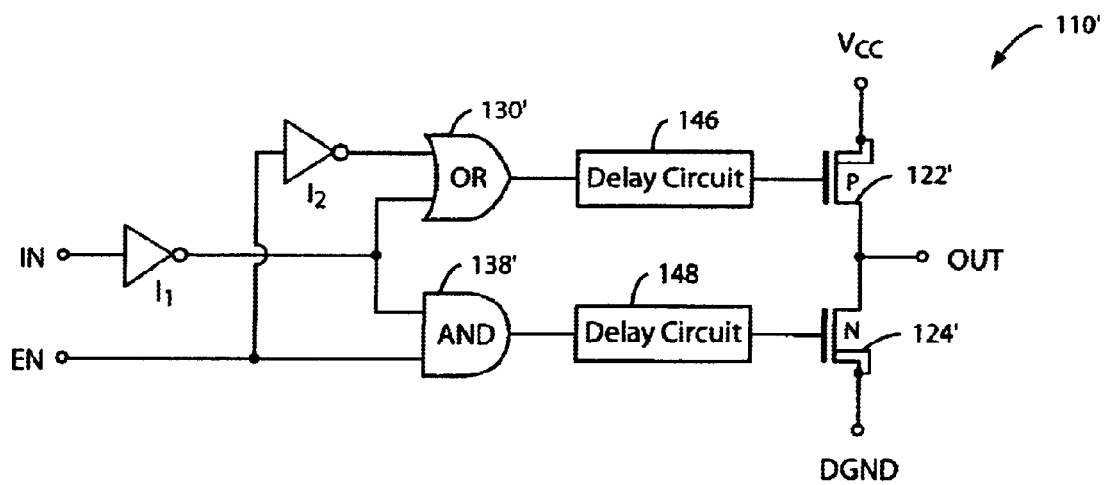
FIG. 5 illustrates a schematic diagram of a gate driver for a power semiconductor device according to another embodiment of the present invention.

FIG. 5 illustrates a schematic circuit diagram of a gate driver 110' according to another embodiment of the present invention. The gate driver 110' is configured to prevent cross conduction in the driver's transistors. Unlike power switches which handle large amounts of currents, the cross conduction of transistors in the gate driver has not been seen as a serious problem. However, cross conduction is a more of concern at higher frequency, i.e., 100 KHz or above. In fact, at 400 KHz or above, the cross conduction issues becomes a significant problem due to excessive current loss.

Accordingly, in high frequency applications, the gate driver 110' includes first and second delay circuits 146 and 148. The first delay circuit 146 provided between an OR gate 130' and a control terminal of an upper transistor 122'. The second delay circuit 148 is provided between an AND gate 138' and a control terminal of a lower transistor 124'. The delay circuits are used to delay the propagation of the driver control signals to the control terminals of the upper and lower transistors. A dead time is provided between the turn-on time of the upper transistor and the turn-off time of the lower transistor to prevent cross conduction. In one embodiment, the delay circuits uses a plurality of inverters in series to obtain the desired signal delay, as explained in more detail below. Generally, the number, size, or type of inverters, or a combination thereof, may be used to obtain the appropriate delay propagation.

Figure 6:
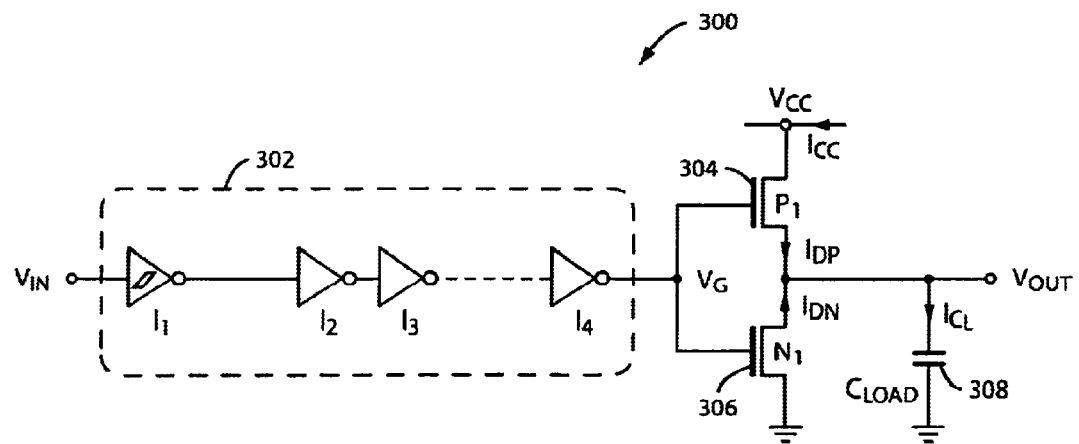
FIG. 6 illustrates a schematic diagram of a gate driver including a delay circuit.

FIG. 6 illustrates a gate driver 300 including a level shift circuit 302 coupled to an upper transistor 304 and a lower transistor 306. The circuit 302 includes a plurality of inverters I1, I2, I3, and I4. The circuit receives an input signal $V_{in}$ of 5V logic level (0V to 5V) and outputs a gate control signal $V_G$ of 15V logic level (0V to Vcc). The gate control signal is applied to the gates of the upper and lower transistors to drive them. The transistors 304 and 306, in cooperation, output a drive signal $V_{out}$ to be applied to a load or power switch 308. The load capacitor $C_{load}$ represents the input gate capacitance of a power MOSFET or an IGBT.

The transistors 304 and 306 are provided in a half bridge configuration. The source of the upper transistor 304 is coupled to a high voltage source Vcc, and the source of the lower transistor is coupled to the ground. The power switch 308 is coupled to a node between the drains of the transistors 304 and 306. The upper transistor 304 is a P type, and the lower transistor 306 is an N type.

Accordingly, if the circuit 302 outputs the gate control signal of logic 0, the upper transistor 304 is turned on and the lower transistor 306 is turned off. A resulting drive signal $V_{out}$ of logic 1 is applied to turn on the power switch. On the other hand, if the circuit 302 outputs the gate control signal of logic 1, the upper transistor 304 is turned off and the lower transistor 306 is turned on. A resulting drive signal $V_{out}$ of logic 0 is applied to turn off the power switch.

Figure 7:
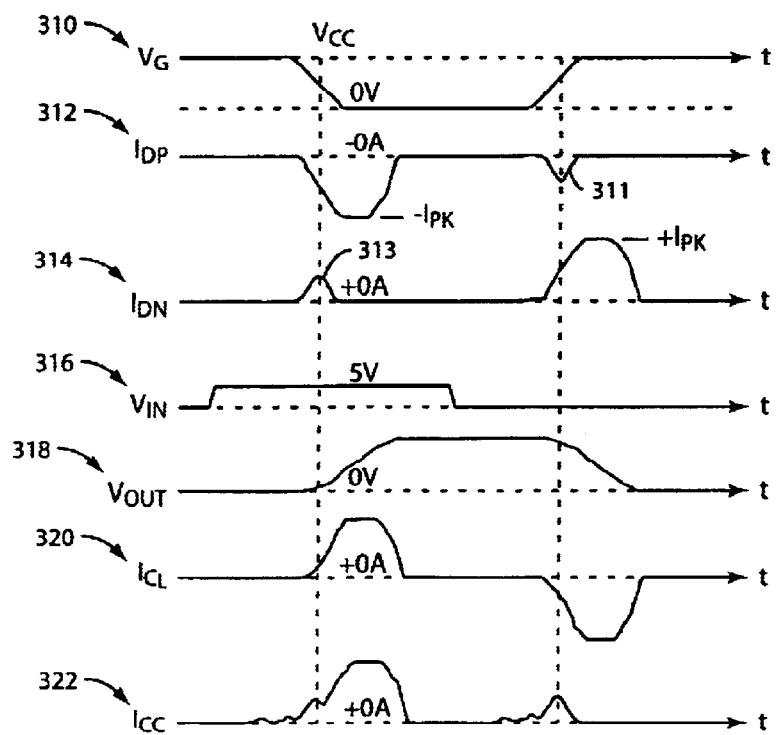
FIG. 7 illustrates timing diagrams for the gate driver of FIG. 6.

FIG. 7 depicts various timing diagrams associated with the gate driver 300. A numeral 310 depicts a timing diagram for the gate control signal $V_G$. A numeral 312 depicts a timing diagram for a drain current $I_{DP}$ of the upper transistor 304. A numeral 314 depicts a timing diagram for a drain current $I_{DN}$ of the lower transistor 306. A numeral 316 depicts a timing diagram for the input signal $V_{in}$ of the circuit 302 A numeral 318 depicts a timing diagram for the output signal $V_{out}$ of the gate driver 300. A numeral 320 depicts a timing diagram for a current $I_{CL}$ flowing to the gate of the power switch 308. A numeral 322 depicts a timing diagram for a current $I_{CC}$ flowing to high voltage source $V_{CC}$.

As indicated by the timing diagrams 312 and 314, both the upper and lower transistors 304 and 306 are turned on for a certain period while the gate control signal $V_G$ transitions from Vcc to 0V or 0V to Vcc, thereby generating cross conduction 311 and 313. The cross conduction diverts part of the current $I_{CL}$ flowing to the power switch 308, which slows the turn-on-and-off characteristics of the power switch. At low frequency, this is not of a particular concern. However, at high frequency, e.g., at 100 KHz or above, particularly at 400 KHz or above, the cross conduction may degrade the device operation significantly.

Figure 8:
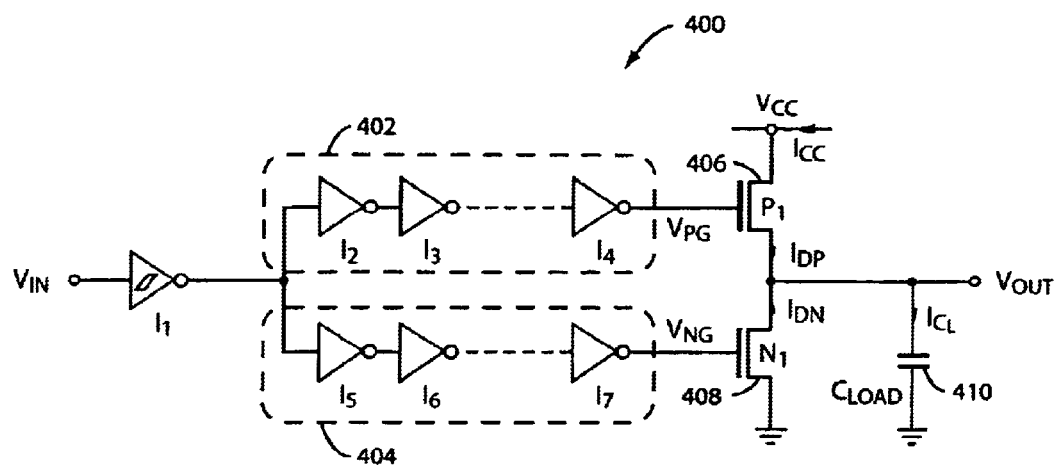
FIG. 8 illustrates a schematic diagram of a gate driver including a first delay circuit and a second delay circuit according to one embodiment of the present invention.

FIG. 8 illustrates a gate driver 400, suitable for high frequency operation, includes a first delay circuit 402, a second delay circuit 404, an upper transistor 406, and a lower transistor 408 to prevent cross conduction according to one embodiment of the present invention. The first delay circuits includes a plurality of inverters I2, I3, and I4, and the second delay circuit includes a plurality of inverters I5, I6, and I7. Since each inverter provides a propagation delay, the number of the inverters provided in each of the delay circuits 402 and 404 is selected to provide a dead time between the turn-on-and-turn-off period of the upper and lower transistors, so that only one transistor is turned on at a time. As used herein, the term "dead time" refers to a period wherein both the upper and lower transistors are turned off.

The transistors 406 and 408 are arranged in a half bridge configuration. The source of the upper transistor 406 is coupled to a high voltage source Vcc, and the source of the lower transistor 408 is coupled to the ground. A power switch 410 is coupled to a node between the drains of the transistors 406 and 408. The upper transistor 406 is a P type, and the lower transistor 408 is an N type.

An input signal $V_{in}$ is applied to the first and second delay circuits via an invertor I1. The input signal $V_{in}$ of 5V logic level is received by the inverters I2 and I5 of the first and second delay circuits, respectively. The first delay circuit outputs a first gate control signal $V_{PG}$ of 15V logic level (0V to Vcc) to the gate of the upper transistor 406. The second delay circuit outputs a second gate control signal $V_{NG}$ of 15 V logic level (0V to Vcc) to the gate of the lower transistor 408. Each delay circuit is selectively provided with a particular number of inverters having predetermined sizes to convert the input signal to the gate control signal, by successively increasing the output current.

Figure 9:
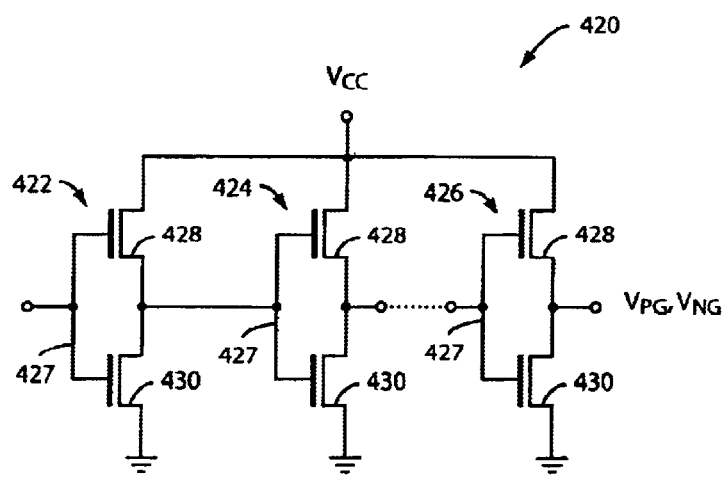
FIG. 9 illustrates a delay circuit of a gate driver according to one embodiment of the present invention.

FIG. 9 illustrates a delay circuit 420 including a plurality of inverters 422, 424, and 426 coupled in series according to one embodiment of the present invention. The delay circuit 420 may represent the first delay circuit 402 or the second delay circuit 404. The inverters include an upper transistor 428 and a lower transistor 430 arranged in a half bridge configuration, where the gates of both transistors are coupled to a common input 427. Generally, the upper transistor 428 is a P type, and the lower transistor is an N type. Accordingly, an input of high voltage results in an output of low voltage, and vice versa. The output voltage may be increased by increasing the size of the transistors.

Referring to FIGS. 7 and 8, in operation, when the first delay circuit 402 outputs a gate control signal $V_{PG}$ of logic 0 to turn on the upper transistor 406, the second delay circuit 404 is configured to output a gate control signal $V_{NG}$ of logic 0 to turn off the lower transistor 408. A resulting drive signal Vout of logic 1 is applied to turn on the power switch. On the other hand, when the first delay circuit 402 outputs a gate control signal $V_{PG}$ of logic 1 to turn off the upper transistor 406, the second delay circuit 404 is configured to output a gate control signal $V_{NG}$ of logic 1 to turn on the lower transistor 408. A resulting drive signal Vout of logic 0 is applied to turn off the power switch.

In one embodiment, each delay circuit is provided with a particular number of inverters, so that the turn-on-and-turn-off operations of the transistors 406 and 408 are synchronized to prevent cross conduction. In the present embodiment, a dead time is provided between the time the turn on periods of the upper and lower transistors, so that only one transistor is turned on at a given time. In another embodiment, the size and various physical dimensions of the transistors of the inverters, such as the transistors 428 and 430, are selectively chosen to obtain the desired delay propagation to obtain a desired dead time. Alternatively, the first and second delay circuits are configured to provide first and second delays, respectively, to turn on one of the transistors 406 and 408 only when the other is substantially turned off, so that any resulting cross conduction would not detrimentally affect the high frequency operation of the gate driver.

Figure 10:
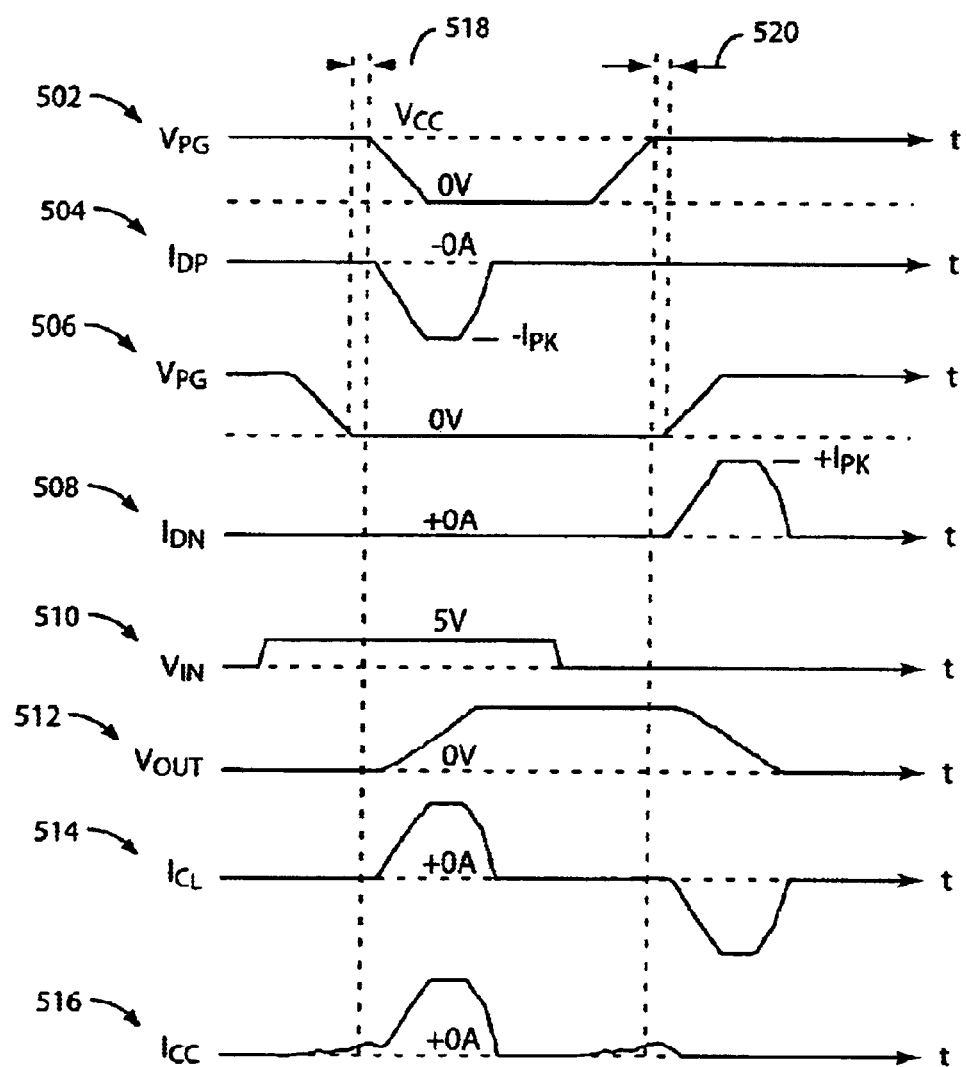
FIG. 10 illustrates timing diagrams for the gate driver of FIG. 8.

FIG. 10 depicts various timing diagrams associated with the gate driver 400. A numeral 502 depicts a timing diagram for the first gate control signal $V_{PG}$. A numeral 504 depicts a timing diagram for a drain current $I_{DP}$ of the upper transistor 406. A numeral 506 depicts a timing diagram for the second gate control signal $V_{NG}$. A numeral 508 depicts a timing diagram for a drain current $I_{DN}$ of the lower transistor 408. A numeral 510 depicts a timing diagram for the input signal $V_{in}$ of the circuits 402 and 404. A numeral 512 depicts a timing diagram for the output signal $V_{out}$ of the gate driver 400 that is applied to the power switch 410. A numeral 514 depicts a timing diagram for a current $I_{CL}$ flowing to the gate of the power switch 410. A numeral 516 depicts a timing diagram for a current $I_{CC}$ flowing to high voltage source $V_{CC}$.

As illustrated by the timing diagrams 504 and 508 on the currents $I_{DP}$ and $I_{DN}$, the gate driver 400 does not have cross conduction problem. Accordingly, substantially all of the current $I_{CL}$ is applied to the power switch 410, as intended, since it is not diverted by the cross conduction. As a result, the power switch 410 may be turned on and off faster, which is particularly desirable in a high frequency operation, e.g., at 100 KHz or above, or at 400 KHz or above, or at 600 KHz or above, or at 800 KHz or above, or at 1 MHz or above.

In one embodiment, the cross conduction problem is eliminated by providing a dead time 518 is provided between the turn off time of the lower transistor 408 and the turn on time of the upper transistor 406. Similarly, a dead time 520 is provided between turn off time of the upper transistor 406 and the turn on time of the lower transistor 408.

The above detailed descriptions are provided to illustrate specific embodiments of the present invention and are not intended to be limiting. Numerous modifications and variations within the scope of the present invention are possible. For example, the upper and lower transistors 406 and 408 of the gate driver 400 are N types in one embodiment of the present invention. In another embodiment, the upper and lower transistors 406 and 408 of the gate driver 400 are P types. Accordingly, the present invention is defined by the appended claims.

What is claimed is:

1. A high frequency gate driver, comprising:
   a first transistor and a second transistor provided in a half-bridge configuration;
   an output node provided between the first and second transistors;
   a first delay circuit coupled to a first control terminal of the first transistor to provide a first delay period for a first gate drive signal being applied to the first control terminal, the first delay circuit provided on a direct signal path to the first control terminal of the first transistor; and
   a second delay circuit coupled to a second control terminal of the second transistor to provide a second delay period for a second gate drive signal being applied to the second control terminal,
   wherein the first delay period is different from the second delay period,
   wherein each of the first and second delay circuits is configured to operate without the use of a feedback signal, and
   wherein the first and second delay circuits provides one of the first and second transistors to be in a non-conducting state before placing the other in a conducting state,
   wherein the second delay circuit is provided on a direct signal path to the second control terminal of the second transistor, so that an output of the second delay circuit is applied directly to the second control terminal of the second transistor,
   wherein the first control signal is associated with a first clock signal, the change of a conductive state of the first transistor being actuated by the first control signal at a period corresponding to the first clock signal,
   wherein an output of the first delay circuit is applied directly to the first control terminal of the first transistor.

2. The gate driver of claim 1, wherein the first and second delay circuits facilitates a reduction of cross-conduction current between the first and second transistors.

3. The gate driver of claim 1, wherein the first transistor is a P-type transistor and the second transistor is an N-type transistor.

4. The gate driver of claim 1, wherein the first delay circuit consists of a plurality of inverters.

5. The gate driver of claim 1, wherein the first delay circuit includes a plurality of inverters.

6. The gate driver of claim 1, wherein the first delay circuit is used to raise a first drive current being applied to the second control terminal of the second transistor to a level sufficiently high enough to drive the second transistor.

7. The power module of claim 6, wherein the plurality of inverters of the first delay circuit are used to provide the first delay period and to raise the first drive current to the level sufficiently high enough to drive the first transistor.

8. The gate driver of claim 7, wherein first and second outputs of the first and second delay circuits are directly coupled to the first and second control terminals.

9. The gate driver of claim 1, further comprising:
   an OR gate coupled to the first terminal of the first transistor, wherein the first delay circuit is provided between an output of the OR gate and the first terminal; and
   an AND gate coupled to the second terminal of the second transistor, wherein the second delay circuit is provided between an output of the AND gate and the second terminal.

10. The gate driver of claim 1, wherein the gate driver is configured to operation at 100 KHz or above.

11. The gate driver of claim 1, wherein the gate driver is configured to operation at 400 KHz or above.

12. The gate driver of claim 1, wherein the gate driver is configured to operation at 800 KHz or above.

13. A gate driver for a power semiconductor switch, comprising:
   first and second transistors in a half-bridge configuration;
   an output node provided between the transistors and coupled to a control terminal of the power switch;
   a first delay circuit to provide a first delay to a first gate drive signal being applied to the first transistor, the first delay circuit being directly connected to a control terminal of the first transistor, the first delay circuit receiving an input signal from a first logic device; and
   a second delay circuit to provide a second delay to a second gate drive signal being applied to the second transistor, the second delay circuit being directly connected to a control terminal of the second transistor, the second delay circuit receiving an input signal from a second logic device, the first and second logic devices being different devices.

14. A driver circuit for a power switch, the driver circuit being suitable for high frequency operation, the driver circuit comprising:
   first and second transistors in a half-bridge configuration;
   a logic device to provide a switch control signal;
   a first delay circuit to receive the switch control signal from the logic device and output a first control signal to a first control terminal of the first transistor, the first delay circuit consisting of a first plurality of inverters to provide a first delay to the first control signal, the first plurality of inverters being configured to provide the first control signal with a first magnitude that is suitable for turning on the first transistor, wherein an output of the first delay circuit is applied directly to the first control terminal of the first transistor; and
   a second delay circuit to receive the switch control from the logic device and output a second control signal to a second control terminal of the second transistor, the second delay circuit consisting of a second plurality of inverters to provide a second delay to the second control signal, the second plurality of inverters being configured to provide the second control signal with a second magnitude that is suitable for turning on the second transistor, wherein an output of the second delay circuit is applied directly to the second control terminal of the second transistor,
   wherein the first plurality of inverters has a different number of inverters than the second plurality of inverters.

* * * * *